(12) United States Patent
Tseng et al.

(10) Patent No.: US 7,109,117 B2
(45) Date of Patent: Sep. 19, 2006

(54) METHOD FOR CHEMICAL MECHANICAL POLISHING OF A SHALLOW TRENCH ISOLATION STRUCTURE

(75) Inventors: Tung-Ching Tseng, Taipei (TW); Syun-Ming Jang, Hsin-Chu (TW); Li-Jia Yang, Tainan (TW); Chuan-Ping Hou, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 171 days.

(21) Appl. No.: 10/757,202

(22) Filed: Jan. 14, 2004

(65) Prior Publication Data

US 2005/0153555 A1 Jul. 14, 2005

(51) Int. Cl.
*H01L 21/461* (2006.01)
*H01L 21/302* (2006.01)

(52) U.S. Cl. ........................ 438/690; 438/692; 438/693
(58) Field of Classification Search ................ None
See application file for complete search history.

(56) References Cited

U.S. PATENT DOCUMENTS

| | | | |
|---|---|---|---|
| 5,652,177 A | 7/1997 | Pan | 437/69 |
| 6,117,748 A | 9/2000 | Lou et al. | 438/400 |
| 6,143,662 A | 11/2000 | Rhoades et al. | 438/690 |
| 6,190,999 B1 | 2/2001 | Hung et al. | 438/424 |
| 6,207,535 B1 | 3/2001 | Lee et al. | 438/435 |
| 6,234,877 B1 | 5/2001 | Koos et al. | 451/41 |
| 6,261,158 B1 | 7/2001 | Holland et al. | 451/63 |
| 6,326,309 B1 * | 12/2001 | Hatanaka et al. | 438/693 |
| 6,365,520 B1 | 4/2002 | Rhoades et al. | 438/690 |
| 6,429,134 B1 * | 8/2002 | Kubota et al. | 438/692 |
| 6,593,240 B1 * | 7/2003 | Page | 438/692 |
| 6,638,866 B1 * | 10/2003 | Cheng et al. | 438/692 |
| 6,824,452 B1 * | 11/2004 | Hung et al. | 451/57 |
| 2003/0166381 A1 * | 9/2003 | Lee et al. | 451/41 |

OTHER PUBLICATIONS

U.S. Appl. No. 2002/0110995 A1 to Kim, Pub. Date Aug. 15, 2002, Filed Feb. 15, 2001, U.S.Cl. 438/427, "Use of Discrete Chemical Mechanical Polishing Processes to Form a Trench Isolation Region".

* cited by examiner

*Primary Examiner*—Duy-Vu N Deo
(74) *Attorney, Agent, or Firm*—Haynes and Boone, LLP

(57) ABSTRACT

A method for chemical mechanical polishing (CMP) of a shallow trench isolation (STI) structure employs a sequence of slurry polishes. In the first step the substrate is polished with either silica-based slurry or diluted ceria-based slurry. The first polishing is at a higher removal rate than the second polishing step. The polishing proceeds with some planarization but does not expose the polish stop layer. After partial planarization, the high selectivity slurry was used to complete the process. Improved throughput, lower defects and good within wafer uniformity are achieved.

8 Claims, 2 Drawing Sheets

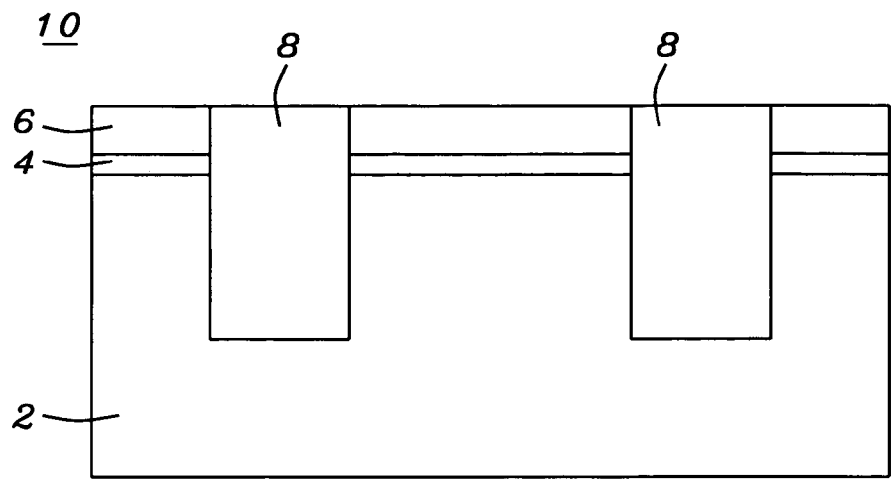
FIG. 3
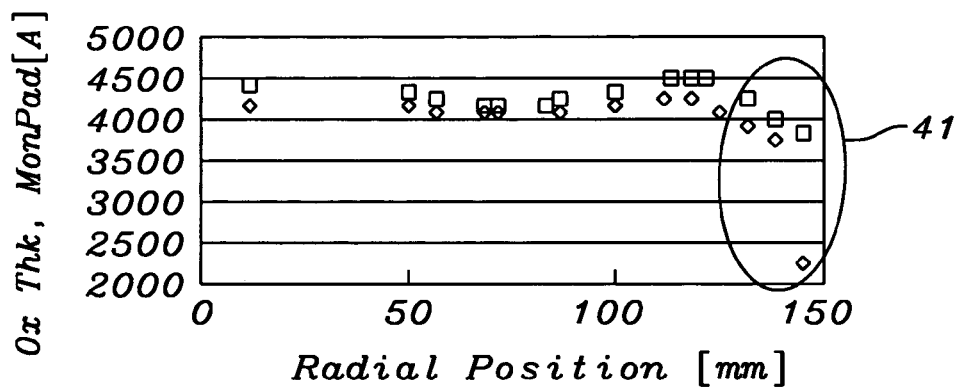
FIG. 4 – Prior Art
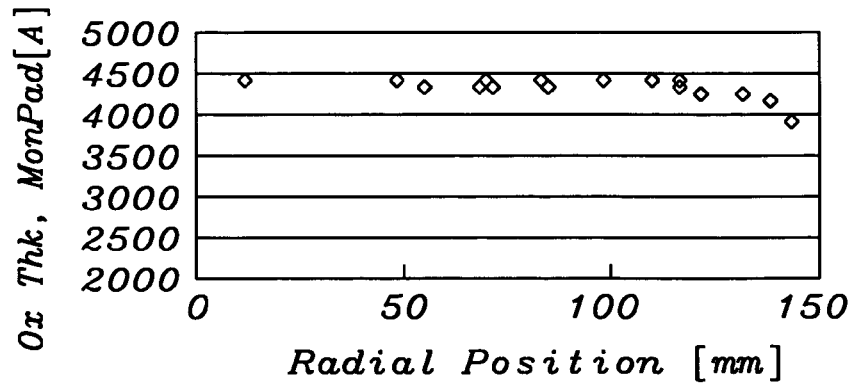
FIG. 5

METHOD FOR CHEMICAL MECHANICAL POLISHING OF A SHALLOW TRENCH ISOLATION STRUCTURE

BACKGROUND OF THE INVENTION

1. Field of Invention

This invention is directed to a method of chemical mechanical polishing and more particularly for planarizing shallow trench isolation or similar structures for integrated circuits.

2. Description of Related Art

Shallow trench isolation (STI) structures are formed between field effect transistors in an integrated circuit to prevent carriers such as electrons from drifting between adjacent device elements. The fabrication of STI structures involves photolithography to form the trench structures followed by filling of the trenches with insulators. Planarization of the filled trenches is usually accomplished by chemical mechanical polishing (CMP). The CMP process uses chemical etchants and abrasives in the form of aqueous slurries to polish the preliminary STI structures. The CMP process is not without throughput issues with larger diameter wafers or defect concerns such as shallow dishes from overpolishing, microscratches or across the wafer non-uniformity. The importance of overcoming some of the deficiencies or cost factors is evidenced by the technology developments directed to the subject as noted in the patent literature.

U.S. Pat. No. 6,365,520 (Rhoades et al) comprises CMP slurry for planarization of STI based on a mixture of two ranges of particle sizes.

U.S. Pat. No. 6,261,158 (Holland et al ) describes a two step CMP process for planarizing metal interconnects with the imposition of a cleansing/neutralization step as intermediate between stages of CMP.

U.S. Pat. No. 6,234,877 (Koos et al) provides a method of controlling the pH of the slurry composition by an intermediate cleansing rinse of the polishing pads with a diluting solution or a buffered solution.

U.S. Pat. No. 6,207,535 (Lee et al) teaches the thermal hardening of a portion of a third oxide layer prior to CMP of that layer in a STI fabrication process.

U.S. Pat. No. 6,190,999 (Hung et al) relates to a STI structure formed by a sequence of film depositions and the intermediate removal of the silicon nitride hard masking layer to expose the pad oxide layer. An insulating layer is formed over the trench; the pad oxide layer then acts as a polishing stop for planarizing the insulating layer.

U.S. Pat. No. 6,143,662 (Rhoades et al) describes for STI planarization a method of using a CMP slurry mixture of abrasive particles having a mean diameter of between 2 and 30 nm and larger abrasive particles having a mean diameter between 2 and 10 times the mean diameter of the small abrasive particles.

U.S. Pat. No. 6,117,748 (Lou et al) describes a dishing-free process for STI consisting of a two-step CMP with an oxide slurry followed by a poly slurry that stops at the surface of the nitride layer.

U.S. Pat. No. 5,652,177 (Pan) encompasses the sequences of forming a field isolation region by depositing an insulating layer, a polysilicon layer, and a nitride layer over a substrate followed by the lithographic patterning and etching of the silicon and nitride layers over the insulating layer. The nitride layer is removed prior to CMP and the polysilicon layer acts as a polishing stop.

SUMMARY OF THE INVENTION

It is the object of this invention to provide a method of CMP of STI structures that achieves high throughput.

It is another object of this invention to provide a method of CMP of STI structures that achieves low slurry consumption.

It is a further object of this invention to provide a two-step method of CMP of STI structures that achieves better within wafer uniformity and lower levels of scratching than a single CMP step.

In accordance with the foregoing and other objectives of this present invention, a method is provided for the planarization and formation of STI structures. A method for chemical mechanical polishing (CMP) of a shallow trench isolation (STI) structure employs a sequence of slurry polishes.

In accordance with this method, initial slurry is used to planarize some of the topography without silicon nitride exposure. In the first step the substrate is polished with either silica-based slurry or diluted ceria-based slurry. Then, high selectivity slurry was used for the rest of the CMP process.

The first polishing process is at a higher removal rate than the second polishing step. The polishing proceeds with some planarization but does not expose the silicon nitride. After partial planarization, the high selectivity slurry was used to complete the process. Improved throughput, lower slurry consumption, a reduction in defects and good within wafer uniformity are achieved.

BRIEF DESCRIPTION OF THE DRAWINGS

FIG. 3 is the final STI structure of the invention after the CMP planarization.

FIG. 4 is a graph of oxide thickness removal vs. radial position across the wafer of the prior art using a HSS only process.

FIG. 5 is a graph of the same oxide thickness removal using the process of this invention.

DETAILED DESCRIPTION OF THE PREFERRED EMBODIMENTS

Figure 1:
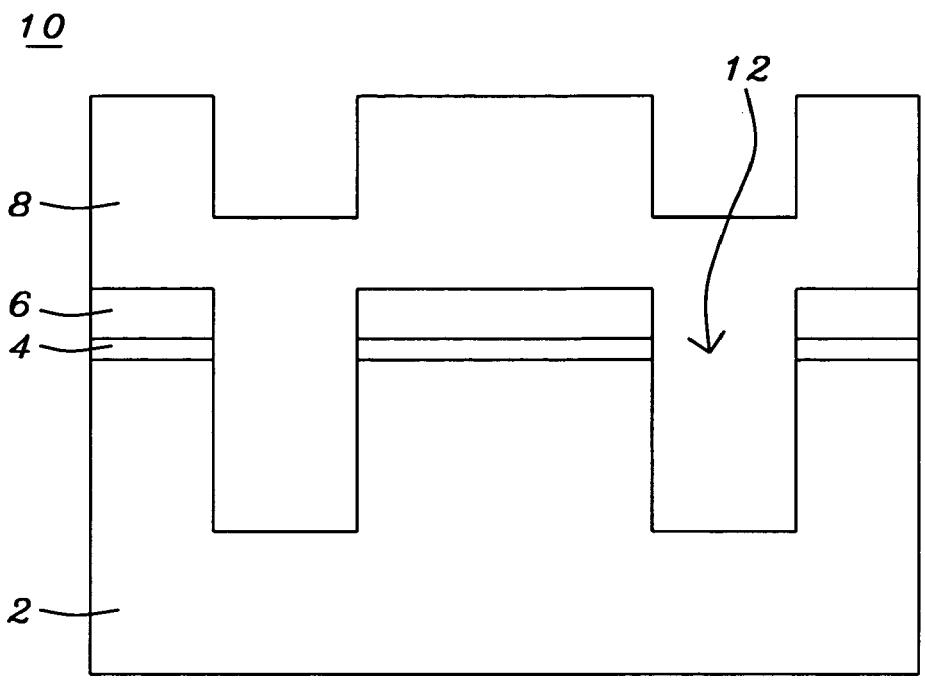
FIG. 1 is a cross section of a STI structure of the invention prior to planarization.

This invention relates to a semiconductor fabrication, and more particularly to a method for fabricating a STI structure to prevent microscratches from occurring on the STI structure during a chemical mechanical polishing (CMP) process. STI structures are described in Hung et al, U.S. Pat. No. 6,190,999 and Rhoades et al, U.S. Pat. No. 6,143,662 and are incorporated as references herein.

The CMP process is one of planarization technologies as described in Hung et al by making use of slurry, which is a chemical reagent, to chemically and mechanically polish the uneven surface of a deposited oxide layer so as to achieve a planarization purpose. Slurry contains a huge number of fine grinding particles with a dimension of about 0.1–0.2 microns. The grinding particles compose a good abrasive. A rotating holder holds the wafer on the backside. The front surface is pushed onto a polishing pad, which is held by a rotating polishing table. Slurry is provided on the contact surface between the polishing pad and the front surface of the wafer. Since they are rotated, the polishing purpose is achieved. The ingredient of slurry is different for a different material to be polished.

During the CMP process, the fine grinding particles may cause a microscratch on a soft material. The microscratch of a softer silicon dioxide layer can be caused by, for example as noted by Hung et al, the harder silicon nitride particles being injected into the slurry composition.

In the chemical mechanical polishing of these patterned substrates, as noted in U.S. Pat. No. 6,143,662, which is incorporated as reference herein, the local polish rate is known to be dependent on the feature size and the local pattern density. Small isolated structures are removed much more quickly than large structures or densely packed small structures. For this reason, in order to produce a planarized integrated circuit structure, there is a narrow process window, i.e., a small range, of effective polishing times. As a result, it is difficult to produce integrated circuit structures without having some regions which are underpolished and/or overpolished by the CMP process. Underpolishing is characterized by incomplete removal of the silicon dioxide overlying the silicon nitride and prevents the silicon nitride from being properly etched in later process steps. Overpolishing is characterized by the complete removal of the silicon nitride at certain locations and subsequent damage to the silicon wafer at these locations. Underpolishing and overpolishing both result in poor device performance.

One type of CMP slurry currently used as noted in U.S. Pat. No. 6,143,662 in shallow trench isolation methods has high selectivity such that the silicon dioxide is removed at a much faster rate than the underlying silicon nitride. These slurries have proven to be effective in removing a blanket silicon dioxide layer deposited over a blanket silicon nitride layer without significantly polishing the silicon nitride layer. However, there is a significant difference between polishing blanket films and patterned wafers. Specifically, the selectivity of the slurry to nitride is significantly different on patterned wafers due to the concentration of force on small isolated features during the CMP process. As a result, these small isolated features are prone to being overpolished even though other features on the same wafer can be at the desired level or even underpolished. Therefore, it is difficult to produce a patterned substrate having uniform silicon nitride thickness over the surface of the substrate. When the pattern density is high the polish time can be very long (10 minutes per wafer). This long polish time not only impacts throughput and slurry consumption but also deteriorates within wafer uniformity and defects due to microscatches. The basic requirements for STI CMP are a high removal rate, good within wafer uniformity, cessation of planarization before silicon nitride is exposed, and a minimal amount of scratches. Direct polish with ceria-based high selectivity slurry (HSS) for STI CMP can achieve a within die uniformity superior to that of silica-based slurry with reverse tone etch. However HSS in CMP is sensitive to pattern density of the design layout. When the polish time is long (~10 min wafer), the long polish time not only impacts throughput and slurry consumption but also deteriorates within wafer uniformity and defect scratch performance. What is needed is a process that increases removal rate without sacrificing within wafer uniformity.

This invention relates to a semiconductor fabrication, and more particularly to a method for fabricating a STI structure, which reduces the level of microscratches from occurring on the STI structure during a CMP process and in a cost effective manner.

The integrated circuit structure with reference to FIG. 1 comprises a cross section (10) of a patterned trench (12) formed on a substrate (2) such as a silicon wafer. A thin insulating layer (4) such as silicon dioxide was previously deposited onto the substrate as a sacrificial layer to protect the substrate during later processing steps. A silicon nitride (SiN) stop layer (6) is also deposited by suitable deposition techniques onto the thin insulating layer. Alternatively, other suitable stop layers can be used in accordance with the invention. After the trench has been formed a blanket film (8) such as silicon dioxide was deposited over the stop layer to form the structure (10). Once the blanket film has been applied, the structure is planarized using a chemical mechanical polishing (CMP) process. As is well known to those skilled in the art, the CMP process involves holding or rotating a semiconductor wafer against a rotating polishing surface under a controlled downward pressure. Chemical mechanical polishing slurry is used to wet the polishing surface and contains an abrasive to facilitate mechanical polishing of the integrated circuit structure. The chemical mechanical polishing process is continued until the structure is effectively planarized. The stop layer can then be removed such as through the use of a wet etchant (e.g. hot phosphoric acid) and/or additional devices and layers can be patterned on the polished integrated circuit structure.

Figure 2:
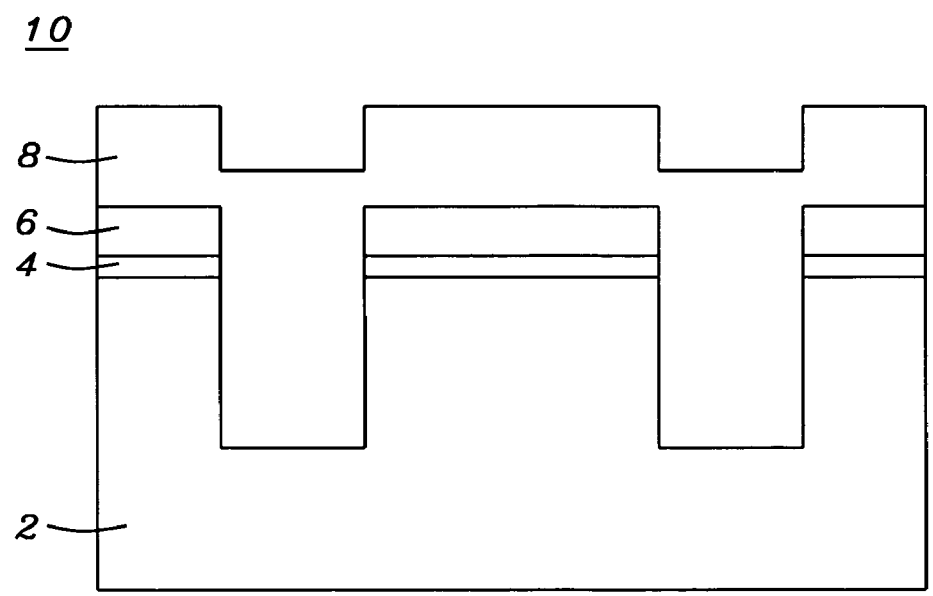
FIG. 2 is a partially planarized STI structure of the invention after the initial CMP step.

The chemical mechanical polishing slurries used in this invention include small abrasive particles of silica, alumina, titania, germania, and ceria, Preferably the small abrasive particles are either silica or ceria. Typical silica-based slurry consists of a range of between 10% and 20% silica by wt. and the water content ranges between 80% and 90% by wt. A typical pad material is polyurethane and the pad pressure is in the range of 1 to 10 lbs/sq. inch. The rotation speed ranges between 50 rpm to 130 rpm. An initial stage of planarization as practiced in this invention is shown in FIG. 2 and the final stage, in FIG. 3.

COMPARATIVE EXAMPLE

A STI structure consisting of silicon dioxide coated over a silicon nitride stop layer was polished with a HSS ceria-based slurry to a stage as depicted in FIG. 3. For example, the concentration of the HSS ceria-based slurry was about 1.5% wt of abrasive.

The uniformity of oxide removal drops quickly (FIG. 4, see 41) during overpolish. The total polish time was 500 sec., which corresponds to about 8 wafers per hour. The total slurry consumption was 2.3 liters/wafer and the scratch count was 70.

Direct polish with a HSS was found to provide better within die oxide step height uniformity after STI CMP than a low selectivity polish; however, the polish time was much longer with HSS especially with high pattern density. Thus the long polish time was found to lead to the following issues: 1.Low throughput, 2.High slurry consumption, 3. Poor with wafer uniformity, and 4. More scratches.

To improve and overcome these deficiencies a staged CMP process was introduced. The structure to be planarized is polished in a first polishing step by CMP using a first slurry. The first slurry is either a silica-based slurry or a diluted ceria-based slurry. The diluted ceria-based slurry has a composition ranging from 0.5 wt % to 1.0 wt % ceria. The first polishing step continues until partial planarization is achieved, but the stop layer is not exposed. In a second polishing step, a second high selectivity slurry is used to complete planarization. The second slurry is a concentrated ceria-based slurry composition ranging from 1.0 wt. % to 2.0 wt. % ceria.

The process of the present invention is shown in the following example.

Example 1

A STI structure was polished with silica-based slurry until the surface topography was more or less planarized, as shown in FIG. 2. In this example, the first slurry had 12 wt. % abrasive. Then HSS ceria-based slurry, having a 1.5 wt. % of abrasive was used for the rest of the polish, as shown in FIG. 3. The uniformity of oxide removal is shown in FIG. 5. The total polish time was 90 sec. This corresponds to 17 wafers per hour. The slurry consumption was 0.4 liters and the scratch count was 50.

Example 2

A STI structure was polished with diluted HSS ceria-based slurry until the surface topography was more or less planarized, as shown in FIG. 2. This first slurry had 0.8 wt. % ceria. Then more concentrated HSS ceria-based slurry of about 1.5 wt. % ceria was used for the remainder of the planarization, as shown in FIG. 3.

The key advantages of the present invention are the improvement in throughput, lower slurry consumption, improved within wafer uniformity, and reduced microscratches. The present invention has been particularly described with respect to STI structure; it is understood by those skilled in the art that one can also apply the sequence of polishing steps of the preferred embodiments to other patterned layers and configurations without departing from the spirit and scope of the invention.

The invention claimed is:

1. A method for the planarization of an integrated circuit structure comprising:
   providing a substrate having a plurality of patterned regions;
   polishing said substrate with an initial chemical mechanical polishing slurry until partial planarization occurs; and
   continuing to final planarization with a second slurry;
   wherein said initial slurry comprises a diluted ceria-based slurry with the compositions that ranges from 0.5 wt. % to 1.0 wt. % ceria; and
   wherein said second slurry comprises a ceria-based slurry with composition ranging from 1.0 wt. % to 2.0 wt. % ceria, said initial slurry and said second slurry having different concentrations of ceria.

2. The method of claim 1 wherein said integrated circuit structure comprises shallow trench isolation.

3. The method of claim 2 wherein said shallow trench isolation comprises silicon oxide, silicon nitride and polysilicon layers in various configurations.

4. The method of claim 1 wherein said polishing said substrate with said initial chemical mechanical polishing slurry until partial planarzation occurs comprises a control of polishing time so as to avoid overpolishing of a stop layer.

5. The method of claim 1 wherein said continuing to final planarization with said second slurry completes said planarization.

6. A method for the planarization of an integrated circuit structure comprising:
   providing a substrate having a plurality of patterned regions wherein said substrate is to be planarized to a stop layer,
   polishing said substrate with a first chemical mechanical polishing slurry composition until partial planarization occurs; and
   thereafter continuing to final planarization with a second slurry;
   wherein said first slurry comprises a diluted ceria-based slurry with compositions ranging from 0.5 wt. % to 1.0 wt. % ceria
   wherein said second slurry comprises a ceria-based slurry with composition ranging from 1.0 wt. % to 2.0 wt. % ceria, said first and second slurries having different concentrations of ceria.

7. The method of claim 6 wherein said integrated circuit structure comprises shallow trench isolation comprising silicon oxide and wherein said stop layer comprises one or more silicon nitride or polysilicon layers.

8. The method of claim 6 wherein said polishing said substrate with said first chemical mechanical polishing slurry composition until partial planarization occurs further comprises a control of polishing time so as to avoid overpolishing of said stop layer.

* * * * *